US010218365B1

(12) United States Patent
 Argoetti (10) Patent No.: US 10,218,365 B1
(45) Date of Patent: Feb. 26, 2019

(54) MICROWAVE FREQUENCY SYNTHESIZERS WITH RAPID FREQUENCY SWITCHING

(71) Applicant: Micro Lambda Wireless, Inc., Fremont, CA (US)

(72) Inventor: Shlomo Argoetti, Sunnyvale, CA (US)

(73) Assignee: MICRO LAMBDA WIRELESS, INC., Fremont, CA (US)

( * ) Notice: Subject to any disclaimer, the term of this patent is extended or adjusted under 35 U.S.C. 154(b) by 0 days.

(21) Appl. No.: 15/968,550

(22) Filed: May 1, 2018

(51) Int. Cl.
| *H03L 7/10* | (2006.01) |
| *H03L 7/089* | (2006.01) |
| *H03L 7/099* | (2006.01) |
| *H04B 7/185* | (2006.01) |
| *H03L 7/00* | (2006.01) |

(52) U.S. Cl.
CPC .............. *H03L 7/0992* (2013.01); *H03L 7/00* (2013.01); *H03L 7/0891* (2013.01); *H03L 7/102* (2013.01); *H04B 7/18513* (2013.01)

(58) Field of Classification Search
CPC ...... H03L 7/00; H03L 7/0891; H04B 7/18513
USPC .......... 331/1 A, 16, 34, 177 R; 327/105, 107
See application file for complete search history.

(56) References Cited

U.S. PATENT DOCUMENTS

| 7,701,299 B2 | 4/2010 | Chenakin |
| 9,734,099 B1 | 8/2017 | Argoetti |
| 9,793,904 B1 | 10/2017 | Chenakin |
| 2010/0123482 A1* | 5/2010 | Marton ................ H03L 7/0891 327/7 |

OTHER PUBLICATIONS

Chenakin, A, "Frequency Synthesis: Current Solutions and New Trends", Microwave Journal, May 2007, pp. 256-266.
Chenakin, A, "Building a Microwave Frequency Synthesizer—Part 1: Getting Started", High Frequency Electronics, May 2008, pp. 58-67.

* cited by examiner

*Primary Examiner* — Arnold M Kinkead
(74) *Attorney, Agent, or Firm* — Stephen E. Zweig (57) ABSTRACT

It was found that certain VCO devices used in microwave frequency synthesizers exhibit prolonged ringing oscillation during extreme voltage jumps above a critical limit, but that this effect could be significantly reduced by splitting the voltage adjustment over multiple steps. This finding was used to improve the switching speed of such devices (e.g. wideband VCO with a computer processor, base frequency generator VCO and a frequency divider). Here, before implementing a command to switch frequencies (by changing the base frequency oscillator and frequency divider settings), the processor first determines if this change will require an extreme voltage jump likely to cause such oscillations. If so, the processor implements this voltage jump as a multiple step process, resulting in a significant reduction in the maximum time required to switch frequencies.

20 Claims, 8 Drawing Sheets

Fig. 1

Prior art

Fig. 2

Prior art

| Base frequency | Divider | F(out) |
|---|---|---|
| 10.00 | 5 | 2.00 |
| 12.00 | 5 | 2.40 |
| 10.00 | 4 | 2.50 |
| 14.00 | 5 | 2.80 |
| 12.00 | 4 | 3.00 |
| 16.00 | 5 | 3.20 |
| 10.00 | 3 | 3.33 |
| 14.00 | 4 | 3.50 |
| 18.00 | 5 | 3.60 |
| 12.00 | 3 | 4.00 |
| 16.00 | 4 | 4.00 |
| 20.00 | 5 | 4.00 |
| 18.00 | 4 | 4.50 |
| 14.00 | 3 | 4.67 |
| 10.00 | 2 | 5.00 |
| 20.00 | 4 | 5.00 |
| 16.00 | 3 | 5.33 |
| 12.00 | 2 | 6.00 |
| 18.00 | 3 | 6.00 |
| 20.00 | 3 | 6.67 |
| 14.00 | 2 | 7.00 |
| 16.00 | 2 | 8.00 |
| 18.00 | 2 | 9.00 |
| 10.00 | 1 | 10.00 |
| 20.00 | 2 | 10.00 |
| 12.00 | 1 | 12.00 |
| 14.00 | 1 | 14.00 |
| 16.00 | 1 | 16.00 |
| 18.00 | 1 | 18.00 |
| 20.00 | 1 | 20.00 |

MICROWAVE FREQUENCY SYNTHESIZERS WITH RAPID FREQUENCY SWITCHING

BACKGROUND OF THE INVENTION

Field of the Invention

This invention is in the field of microwave frequency synthesizers.

Description of the Related Art

Frequency synthesizers, in particular microwave frequency synthesizers, that often operate in the about the 650 MHz to the 20 GHz frequency range, are used for many applications including acting as local oscillators for receivers, frequency converters, testing equipment, and measuring equipment. Such systems are described by Chenakin, "Frequency Synthesis: Current Solutions and New Trends", Microwave Journal, May 2007, pages 256-266; and Chenakin "Building a Microwave Frequency Synthesizer—Part 1: Getting Started" in High Frequency Electronics, May 2008, pages 58-67, and elsewhere.

Simple frequency synthesizers include conventional or generic single phase lock loop (PLL) frequency synthesizer. This is also occasionally referred to as an "integer-N single-loop PLL synthesizer." These circuits are based on a voltage controlled oscillator (VCO) whose frequency output is locked in relation to a reference frequency by a feedback loop. In some embodiments, the output frequencies of these VCO can be processor controlled, for example by using a computer processor with a digital output that is converted, such as by a digital to analog converter, into a corresponding voltage that is then used to set the frequency of the VCO.

In such devices, the frequency signal output from the VCO can go to a power splitter (PS) which splits this VCO frequency signal into various portions. One portion is the output signal (f), and another portion of this VCO frequency signal is used to control the PLL synthesizer. This control portion of the VCO frequency signal is sent to a frequency divider, which can be a programmable frequency divider here designated (:N), which can divide this portion of the VCO frequency signal by an integer N. The resulting frequency divided signal then goes to a phase detector (PD). The phase detector compares this signal with a reference frequency (FREF).

More complex microwave frequency synthesizers are also possible. Prior art in such devices includes the work of Ma, U.S. Pat. No. 5,912,595, Chenakin, U.S. Pat. Nos. 7,701, 299, 8,373,463, and 9,793,904, the contents of all of these are incorporated herein by reference.

Higher quality frequency synthesizers generally have various characteristics, including larger frequency ranges, low phase noise, high frequency resolution, and rapid switching speed.

An example of prior art frequency synthesizer includes the QuickSyn Lite Frequency Synthesizer, produced by National Instruments, Santa Clara, Calif. This device is an SPI interface controlled device that uses various SPI hardware and peripherals to set the output frequency of the synthesizer. This device is described in more detail in, "COMMUNICATIONS SPECIFICATIONS QuickSyn Lite Frequency Synthesizer", DOC. NO. 5580522-01|REV.C| ECN 001641", published by National Instruments in 2016. This device has a frequency range from about 650 MHz to 20 GHz, and a frequency switching time of 100 microseconds.

BRIEF SUMMARY OF THE INVENTION

The invention was inspired, in part, by the insight that in addition to improved frequency ranges (e.g. 50 MHz to 21+ GHz), improved frequency synthesizers with faster switching speeds, (e.g. substantially less than 100 microseconds would be of high commercial interest.

The invention was also inspired, in part, by the insight that to change the output frequency of microwave frequency synthesizers, often the configurations of a plurality of electronic components (internal peripherals, such as SPI bus controlled peripherals) must be rapidly, indeed preferably simultaneously, adjusted by a computer processor, preferably under precise clock speed control. Here, the methods of commonly owned and invented U.S. Pat. No. 9,734,099, incorporated herein by reference, can be useful.

The invention was also inspired, in part, by the observation that commercially available wideband VCO, such as Analog Devices HC733 devices and the like, often suffer from performance fall-off around the upper end of their frequency range. As will be discussed, this performance fall-off can manifest itself as instability (e.g. prolonged oscillation or ringing) in the output signals at or around the upper end of the frequency range. An important aspect of the invention was the finding that even when high speed peripheral adjustment methods (such as the methods of U.S. Pat. No. 9,734,099, such instability can nonetheless still act to reduce the switching time down to prior art levels unless the invention's novel switching methods are also used.

Thus in some embodiments, the invention can be a device, system, or method for optimizing a frequency switching speed of a base frequency generator (BFG). Typically this base frequency generator will be employed as part of a microwave frequency synthesizer (also called a wideband VCO or WVCO) comprising a processor (e.g. a CPU), a processor controlled base frequency generator, and a processor controlled frequency divider.

The output frequency of this microwave frequency synthesizer (WVCO) can be viewed as being the output of the base frequency generator divided by the division coefficient of the frequency divider. Thus to set this output frequency, the processor must command the system (often through a suitable digital to analog converter) to produce a first voltage setting to drive the base frequency generator at the desired base frequency, and then also command the system's frequency divider to select the appropriate division coefficient. The combination of these settings produces the desired output frequency.

As will be discussed, the invention is based on the insight that for the base frequency generator, above a certain critical voltage (and corresponding critical frequency), which is often around the top end of the voltage and frequency range, the base frequency generator can start acting in a non-ideal manner, and can produce base frequency oscillations that require a prolonged time to stabilize. This can result in the microwave frequency synthesizer having a longer than optimum frequency switching time.

Although these base frequency oscillations will eventually dampen, they require a longer than optimal stabilization time to do so. However, according to the invention, if voltage is applied in a two or more step process, with appropriate voltage levels and timing, these oscillations can dampen more quickly, resulting in a base frequency generator with rapid frequency time, and hence an overall microwave frequency synthesizer with superior switching time, relative to prior art frequency synthesizers of this type.

According to the invention, when switching from a first commanded output frequency to a second commanded output frequency requires that the processor command the base frequency oscillator VFO to transition from a lower frequency (often a lower or lowest frequency as determined by a lower or lowest VCO voltage) to a very high frequency (such as over the critical frequency and critical voltage, where the undesired base frequency oscillations and prolonged stabilization time), the prolonged stabilization time can be avoided by configuring the processor to implement this voltage transition as a two (or more) step process.

According to this two-step process, this transition is managed by configuring the processor to command a first step voltage increase to the base frequency oscillator VCO that is below the critical level, and then quickly (within a few microseconds) commanding a second voltage increase to the vase frequency oscillator VCO that takes the voltage above the critical level. This two (or more) step process can reduce the time duration of the undesired oscillations from about 90 microseconds, which is overly long, to a much faster stabilization time, such as about 30 microseconds.

DETAILED DESCRIPTION OF THE INVENTION

In this disclosure, the terms "microwave frequency synthesizer" and "wideband VCO", "wideband frequency synthesizer", and WVCO will be used interchangeably. Thus a "wideband VCO" is another term for "microwave frequency synthesizer" and a "wideband frequency synthesizer".

Figure 1:
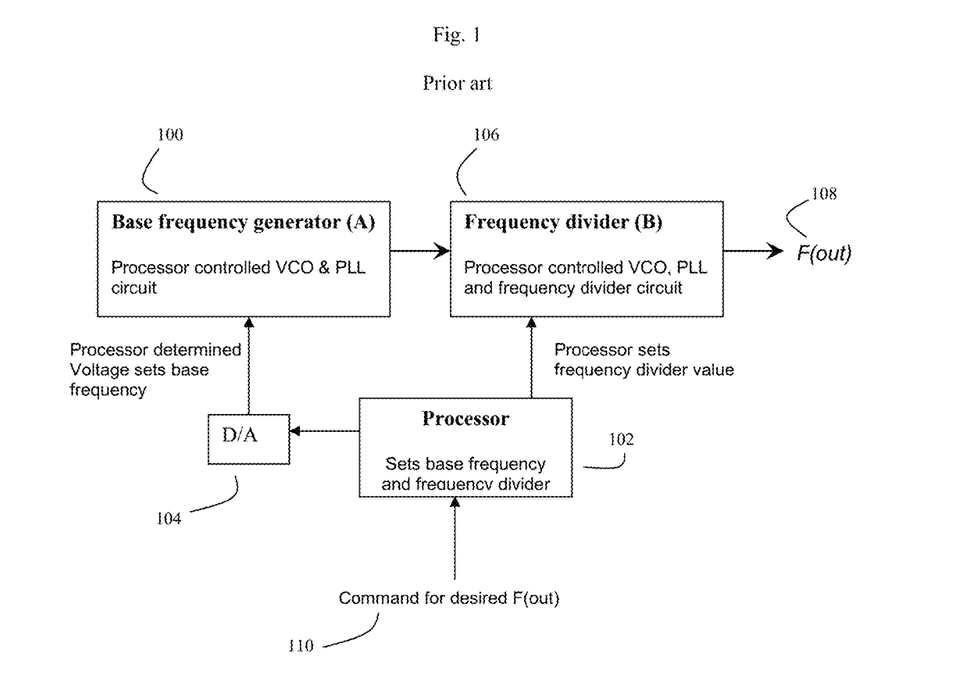
FIG. 1 shows a block diagram of a prior art computer controlled wideband frequency synthesizer.

FIG. 1 shows a simplified block diagram of a computer controlled wideband frequency synthesizer. This device typically comprises a base frequency generator (100), which uses a voltage controlled oscillator (VCO) and often phase locked loop (PLL) circuitry to produce a base frequency output, often in the 10 GHz to 20+ GHz range. The frequency of this VCO is determined by the input voltage, which here is in turn commanded by the device processor (102), optionally through additional circuitry such as digital to analog converters (D/A converters, 104) and the like.

The output from this base frequency generator then is further adjusted using a frequency divider circuit (106), which in some embodiments, can have its own VCO and phase lock loops (PLL), as well as a programmable frequency divider circuit.

This frequency divider circuit (106) divides the output of the base frequency generator (100), usually according to a divisor value (which can be integer values such as 1, 2, 3 . . . n). These divisor values are both determined by, and commanded by, the device processor (102), producing the final wideband frequency synthesizer output F(out) (108). The device processor can adjust F(out) by, for example, controlling both the voltage input to the base frequency generator VCO (often by controlling an optional Digital to Analog converter 104), as well as controlling the frequency setting of the frequency divider circuit. Thus once commanded (110) to produce the desired F(out), the processor will compute the necessary voltage and frequency division settings and in turn issue the appropriate base frequency output and frequency divider outputs to (100 optionally via 104, and 106) to achieve this goal.

For simplicity, further discussion of any intermediate voltage control circuitry such as D/A converter (104) will be omitted, and the discussion will simply speak of using the processor to control the setting of the base frequency generator VCO.

Thus according to the invention, the base frequency generator (100) with its base frequency VCO will often comprise a phase locked loop (PLL). Further, the frequency divider (106) will often comprise a frequency divider VCO, a phase lock loop (PLL), and a frequency divider circuit.

Figure 2:
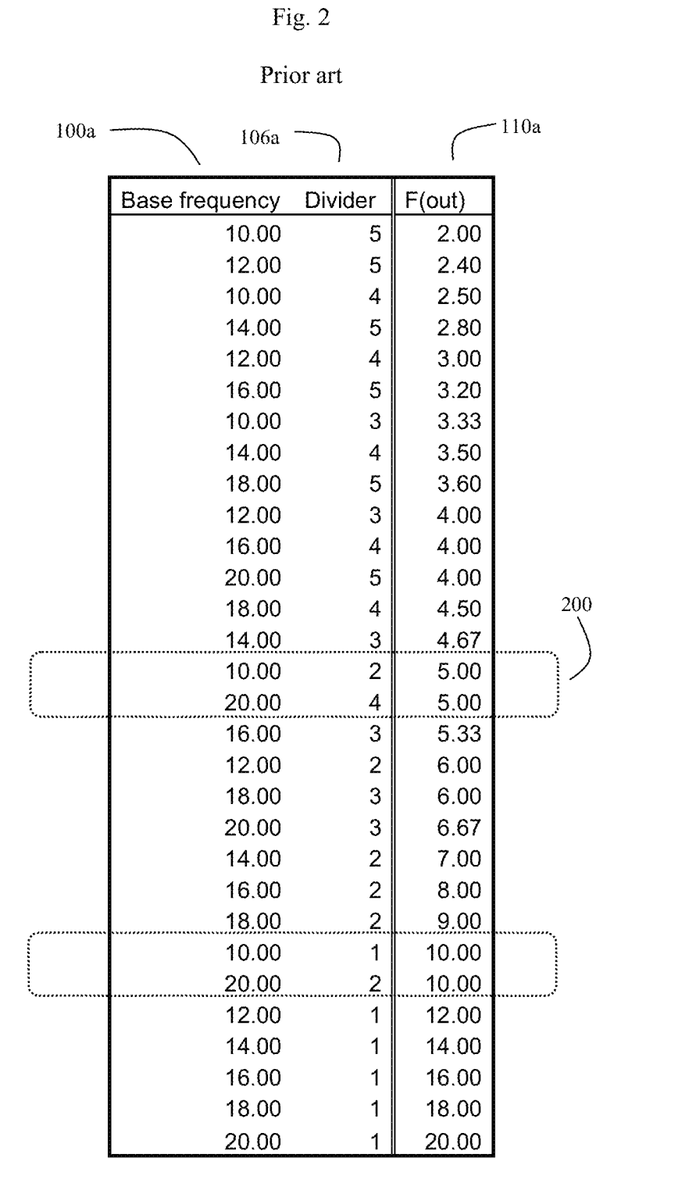
FIG. 2 gives a very simplified example of how the prior art wideband frequency synthesizer output F(out) can be set, by the processor, over a wide range of different frequency values by various combinations of base frequency voltage settings (Base frequency) and frequency divider circuit (Divider) settings.

FIG. 2 gives a simplified example of the processor (102) can take a command for the desired F(out) (110, 110a) and use this to compute the appropriate settings for the base frequency generator (100, 100a) and the frequency divider (106, 106a).

More specifically, FIG. 2 shows how the wideband frequency synthesizer output F(out) can be set, by the processor, over a wide range of different frequency values by various combinations of base frequency voltage settings (Base frequency 100a) and frequency divider circuit (Divider 106a) settings. By setting the divider to a high value, relatively low output frequencies can be obtained, while by setting the divider to a very low value, such as 1, F(out) can be set to a very high frequency that is essentially the same as the value of the base frequency generator when its VCO is set to a highest voltage.

Note that as F(out) extends through various combinations of base frequencies and divider settings, various combinations (200) of adjacent F(out) frequencies can occur when the processor switches from the lowest base frequency (lowest VCO voltage) at a lower frequency divider setting to a highest base frequency (highest VCO voltage) at a higher frequency divider setting. These major voltage jumps have been found to be particularly problematic, particularly at the end or just beyond the maximum rated VCO setting, and can result in prolonged oscillation times. Yet surprisingly, as will be discussed shortly, alternative voltage changing schemes can allow the base frequency oscillator to operate sometimes even beyond its maximum voltage and frequency setting, without prolonged oscillation times.

Figure 3:
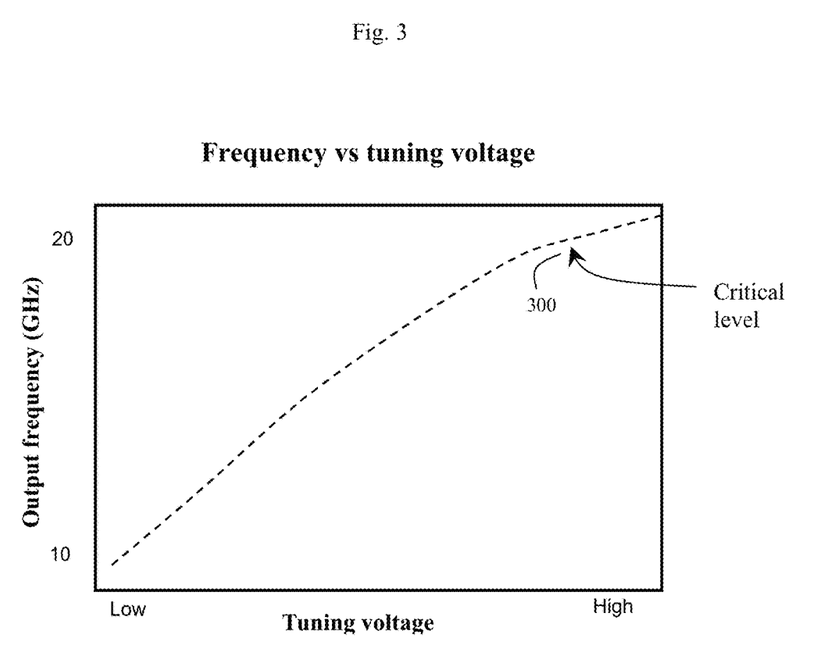
FIG. 3 shows an example of an output frequency versus tuning voltage graph for the VCO devices described herein.

FIG. 3 shows an example of an output frequency versus tuning voltage graph for base frequency generator (100) VCO devices described herein (here exemplified by the Analog devices HMC733 VCO device). Note that although the VCO's output frequency versus input voltage has a relatively consistent slope throughout most of the voltage range, the device has a maximum response value or critical value (300) where at higher voltages, the VCO device starts to reach its limits. Specifically, the output frequency versus input tuning voltage may start to level off, and/or the VCO may start taking a longer amount of time to stabilize after extreme voltage jumps. As will be discussed, at or above these boundary conditions, other undesirable effects (e.g. frequency oscillations) may also occur.

Digitally controlled VCO circuits, such as the Analog Devices HC733 chip, need to achieve a clock frequency lock (CFL) in order for the chip to properly act to change frequency. If the time to achieve CFL lock increases, the VCO chip will react (change frequency) slower.

Figure 4:
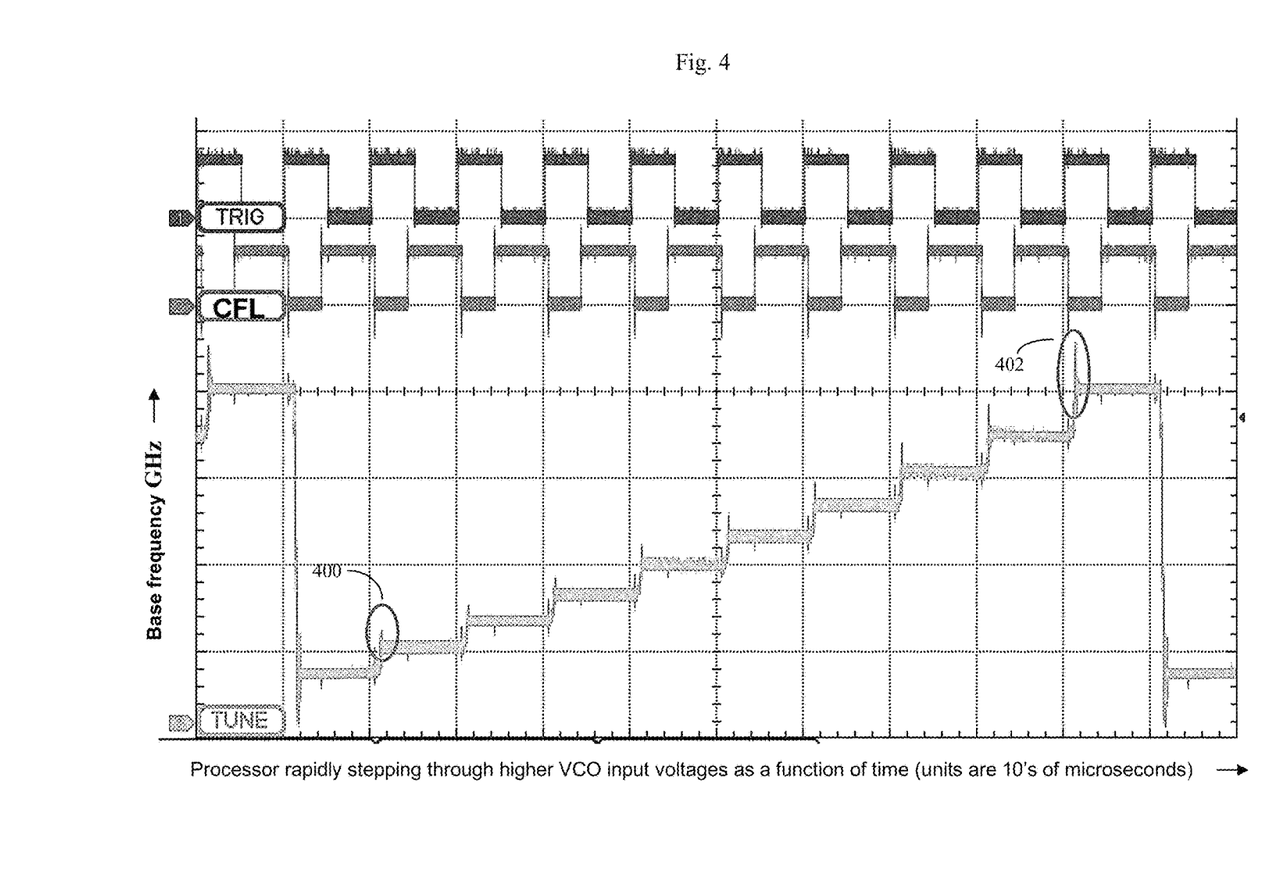
FIG. 4 shows that as the processor commands the base frequency generator VCO to jump to from a lower to a higher frequency, the base frequency generator circuit initially overshoots the desired frequency, causing a small spike, and then settles down to the desired frequency.

FIG. 4 shows that as the processor commands the base frequency generator VCO to jump to from a lower to a higher frequency, such devices can experience a greater ringing oscillation. Here the base frequency generator circuit initially overshoots the desired frequency, causing a small spike, and then settles down to the desired frequency. This problem tends to be more severe at higher voltages and frequencies. Thus FIG. 4 shows that at lower applied voltages (producing lower frequency output) near the lower end of the VCO device's range, the effect is not as severe (400). However, at higher applied voltages (producing a higher frequency output) nearer to the top end of the VCO device's range, this unwanted ringing oscillation effect is more severe (402)

Figure 5:
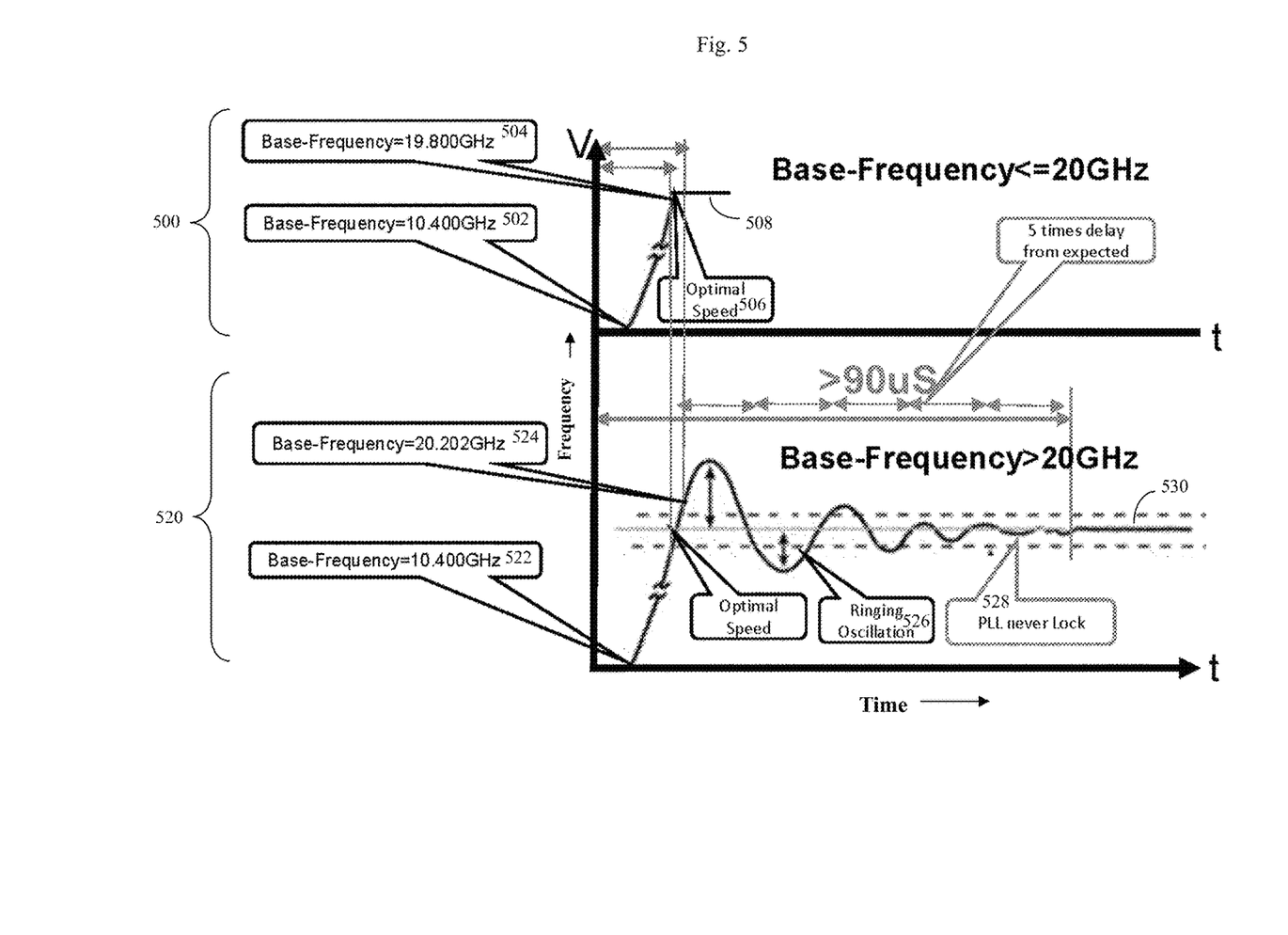
FIG. 5 shows problems that can occur when the processor commands the base frequency generator VCO to jump from an extreme low voltage to an extreme high voltage. This can produce prolonged ringing oscillations requiring an unacceptably long time to dampen.

FIG. 5 shows problems that can occur when the processor commands cause the base frequency generator VCO applied voltages to jump from an extreme low voltage (here a voltage resulting in a 10.4 GHz output) to an extreme high voltage either slightly below (500), or slightly above (520), the critical level (300).

Slightly below critical level: as shown in FIG. 5 (500), when the jump is between a lower voltage near the lower frequency limit (such as 10.4 GHz 502) to a higher voltage near the upper frequency limit (in this example 20 GHz), but slightly below the critical level (such as 19.8 GHz, 504), the VCO device can implement this jump without experiencing an undue amount of frequency oscillations. This allows the VCO chip to respond quickly (e.g. at optimal speed 506) after the voltage increase, and the VCO output frequency will often stabilize approximately 5 microseconds after the voltage increase or jump (508).

Slightly above the critical level: as shown in FIG. 5 (520), however, when the jump is between a lower voltage near the lower frequency limit (such as 10.4 GHz 522) to a higher voltage somewhat over the upper frequency limit (again 20 GHz), but slightly below the critical level (such as 20.202 GHz, 524), the VCO device immediately after the jump now experiences a prolonged slowly dampened ringing oscillation (526) that can take overly long, such as 90 microseconds or more, before the PLL devices (528) can lock onto the new frequency and stabilize it. The VCO will eventually stabilize after a much longer time (530), such as 90 microseconds or more, after the voltage increase or jump. This causes the switching speed of the frequency synthesizer to become unacceptably long, often on the order of 100 microseconds or more. Thus the invention is in part, a discovery of this prolonged VCO stabilization time, and a realization that improving this prolonged stabilization time would result in faster switching frequency synthesizers (wideband VCO). But how can this prolonged VCO stabilization time be fixed?

Figure 6:
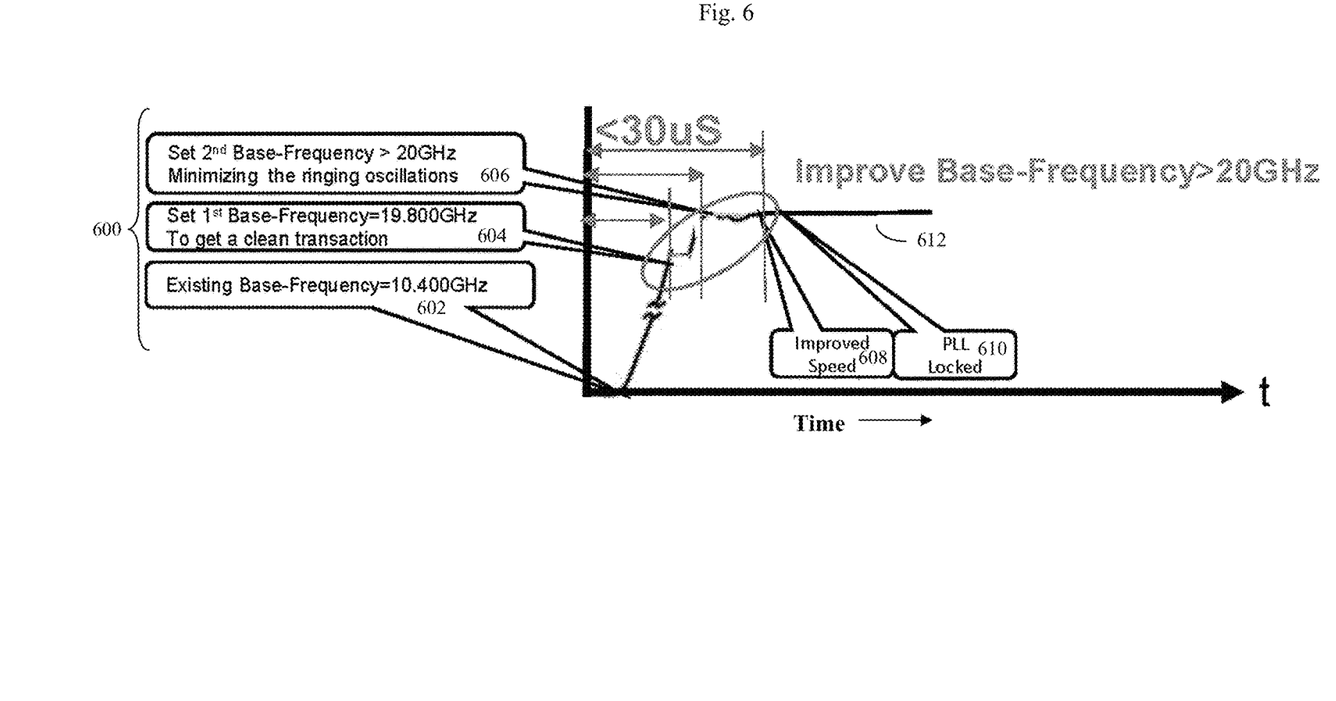
FIG. 6 shows that if the processor instead commands the extreme voltage jump to be accomplished as a very rapid two-step process, the problem of prolonged ringing oscillations can be significantly reduced.

FIG. 6 shows that the invention is also based, in part, on the finding and insight that a hardware/software implemented technique can be used to solve this prolonged VCO stabilization time problem. According to this unexpected finding, the prolonged ringing oscillation time caused by extreme voltage jumps from a voltage level near the lower end of the VCO frequency range, to a voltage level above the critical level (which may be near or even somewhat above the nominal upper end of the VCO frequency range can be greatly reduced by implementing this voltage jump as a two (or more) step process (600). This reduces the length of time need to dampen the VCO ringing oscillations, allowing PLL devices to thus lock into the new frequency more quickly, such as in less than 30 microseconds, rather than the 90 microseconds otherwise needed as shown in FIG. 5 (520).

In the first step, of this very rapid two (or more) step voltage increase process, when a voltage jumps from a very low voltage (and VCO frequency) to a very high voltage (and VCO frequency above the critical level) is needed, the processor does not attempt to do this all in one step. Instead, the processor first commands a jump from the very low VCO voltage (such as a VCO voltage of 10.4 GHz, near the lower end of the VCO voltage frequency range 602), to a much higher VCO voltage (and a much higher VCO output frequency 604) that is near the upper range of the VCO voltage/frequency response, but below the critical level (300). Here this upper range below the critical level is 19.8 GHz. This is just short of the voltage level where undesired ringing oscillations occur.

Then, typically within about 10 microseconds of this first voltage jump, the processor then commands the VCO voltage to take a second voltage jump up from a voltage and frequency that is just below this critical level (604) to the final desired frequency level above the critical level (606) where (if this voltage jump was done in just one step) prolonged ringing oscillation times normally would occur.

Surprisingly, this rapid two-step voltage adjustment process—a first larger voltage jump followed within about 10 microseconds by a smaller voltage jump, achieves the desired higher frequency without unwanted ringing oscillations. The net effect is that the PLL devices can lock much more quickly (610), resulting in a significantly faster switching speed (608). The VCO then reaches a stable frequency (612) in less than 30 microseconds, rather than the 90 microseconds or more that would normally be required.

Note that in some embodiments of the invention, all or nearly all voltage jumps (frequency increases) may be implemented by a two-step or more process, in which the VCO voltage is first commanded to a first frequency that may be within 80-90% of the difference between the present voltage and the target voltage, and then in one or more steps jumped up to the final target voltage. However for most voltage and frequency increases, a multi-step voltage change is not needed, and at the same time, the multi-step voltage changes can take some additional switching time (e.g. on the order of 10 microseconds or so). Thus to achieve a quicker average frequency response time over a broad range of frequencies, in some embodiments such multi-step voltage adjustment (jump) processes will be reserved for those occasions where they are most needed.

Thus as described in FIG. 5 and FIG. 6, often the invention will be used in situations where the base frequency oscillations from base frequency generator (100) are damped ringing oscillations (526) with an undesired stabilization time, such as a time greater than 50 microseconds before stabilization (530). Further, according to the invention, the time difference between the initial voltage/frequency adjustment step (605) and the subsequent (or $2^{nd}$) voltage/frequency adjustment step (606) is less than 20 microseconds.

Figure 7:
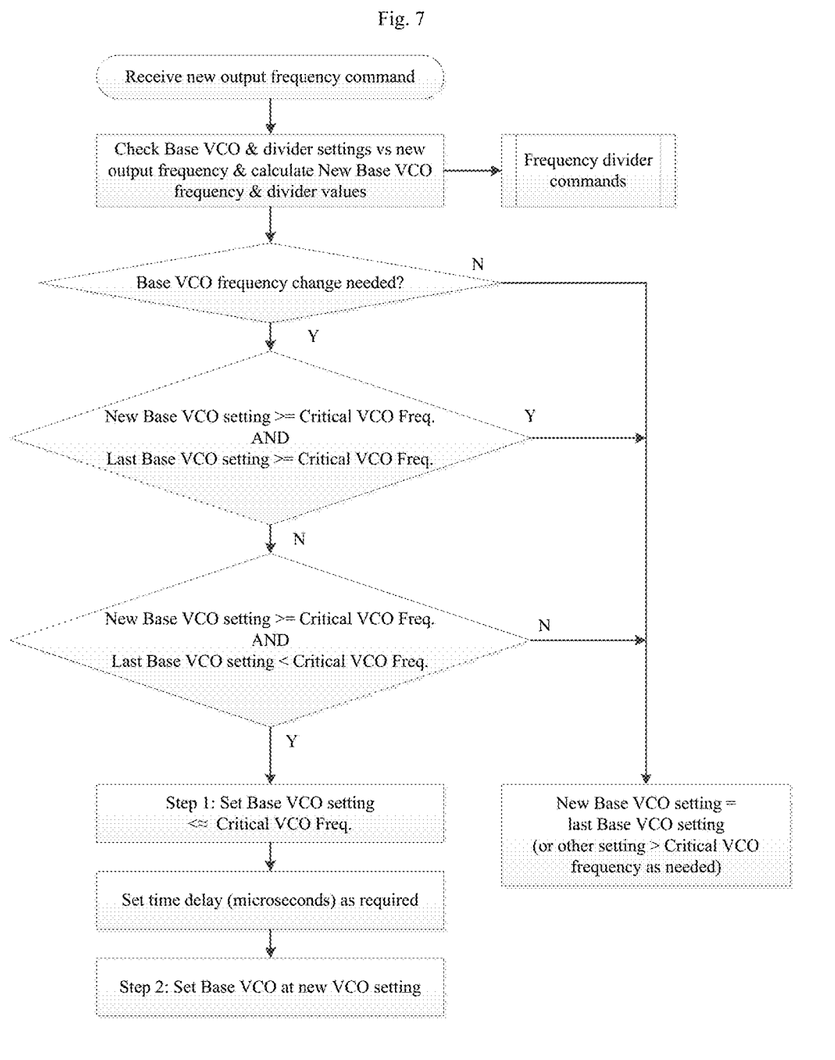
FIG. 7 shows a flowchart showing how, according to the invention, the microwave frequency synthesizer processor may be configured to produce an improved frequency synthesizer with much faster frequency switching times.

FIG. 7 shows an example of how, according to the invention, the wide frequency synthesizer's processor may be configured to produce improved (faster) switching times. According to this improvement, upon receiving a command to produce a particular output frequency F(out), the invention's processor will (in addition to calculating the proper frequency divider value) first determine if achieving this goal will require an extreme change in the VCO voltage setting. If so, the processor will implement the VCO voltage setting as a rapid two (or more) step process to avoid unwanted ringing oscillations. If this goal will not require an extreme change in the VCO voltage setting, then the processor will, as appropriate, either keep the VCO voltage setting the same, or alternatively implement the VCO voltage setting as a single step process.

Thus in some embodiments, the invention may be a device, system or method for optimizing a frequency switching speed of a computer (e.g. processor) controlled wideband VCO (FIG. 1) comprising a computer processor (102), a base frequency generator VCO (100) and a frequency divider (106). This method can be implemented by using the processor (102) to set a first output frequency (108) of the wideband VCO by providing a first voltage setting command (which can in some embodiments use additional circuitry such as D/A converters 104) and first voltage to the base frequency generator VCO (100), causing the base frequency generator (100) to produce a base frequency output. The processor (102) will also provide (or output) a frequency division value command to the frequency divider (106). This will direct the frequency divider (106) to divide the base frequency output by the frequency division value, resulting in a frequency output F(out) (108).

Thus the wideband VCO output frequency (108) of the wideband VCO is determined by the base frequency output produced by the base frequency generator (100) divided by the frequency division value produced by the frequency divider (106).

In some embodiments, the lowest frequency of the base frequency generator (100) VCO is also a multiple of a lowest frequency of the wideband VCO (108). Thus for example, if the lowest frequency of the wideband VCO (108) is 500 MHz, the lowest frequency of the base frequency generator (100) might be 10 GHz, and the frequency divider (106) may divide this by a factor of 20. Thus the 10 GHz lowest frequency of the base frequency generator (100) can be a multiple (here 20x) of the 500 MHz lowest frequency of the wideband VCO (108). As a result, in order to set the frequency of the wideband VCO, which is F(out) (108), the processor (102) must determine both the first voltage setting command to the base frequency generator (100) and the frequency division value command to the frequency divider (106) in order to direct the wideband VCO to deliver an arbitrary frequency output (108).

When it receives a command to switch output frequency (108), the processor (102) can either compute or look up the required input voltage to the base frequency generator (100) to produce a desired base frequency, and also determine the appropriate frequency divider value to send to the frequency divider (106), as previously discussed in FIG. 2. The processor can also have the critical levels stored in memory so that it can determine in advance when a particular change in frequencies is going to cause the VCO in the base frequency generator (100) to exceed the critical level (e.g. condition 200, 300), or not.

Although the invention can operate in a mode in which all voltage adjustments are done as a two or more step process, this may overly slow down switching speed for those majority of VCO voltage adjustment steps where a single voltage change produces adequate results. Thus to try to operate at an optimal speed in all situations, in some embodiments, the present invention can use a two or more step voltage/frequency adjustment process to implement a change in input voltage in at least those critical limit situations. That is, situations where the processor can calculate that a voltage transition above a critical level (to the base frequency generator VCO 100) will produce base frequency oscillations (526) with an undesired stabilization time (530, such as 90 microseconds) that exceeds the desired stabilization time (508, such as 30 microseconds or under).

In these situation, the invention's processor can operate to switch the wideband VCO output frequency (108) from a first to a second wideband VCO output frequency (108) by using the processor to determine in advance, when the second wideband VCO output frequency will require a second voltage setting command with a second voltage that will exceed this critical level (200, 300). When this determination is made, instead of doing a single frequency/voltage adjustment, the processor may be configured to adjust the second output frequency of said wideband VCO (108) by implementing the second voltage setting command (e.g. the jump from the first voltage/frequency to the second voltage/frequency as at least a two-step process (although more than two steps are also contemplated, here a two-step example is given).

Here, the frequency/voltage can be adjusted using an initial step, where this initial step is an initial step voltage resetting command that provides voltage to the base frequency generator VCO (100) at an initial step level above the first voltage (602), but below the critical level (604, 300), this can then be followed (usually very quickly, such as within 10 microseconds or less) with a subsequent step. This subsequent step can be a subsequent voltage resetting command (606) that provides voltage to the base frequency generator VCO (100) at a second voltage setting (that is above the critical voltage (300). In order to achieve a speed improvement, typically the time difference between this initial step and the subsequent step should be less (e.g. significantly less, such as ½, ⅓, ¼, ⅕ or less) than the undesired stabilization time. In the examples used here, where the undesired stabilization time is 90 microseconds, this time difference may be on the order of 10 microseconds, or even 5 microseconds. Here the optimal time difference values will often be determined experimentally or using appropriate circuit modeling software.

More specifically, in some embodiments, this first voltage causes the base frequency generator (100) VCO to provide a base frequency output at the lowest frequency of the base frequency generator VCO (e.g. 602). The second voltage causes the base frequency generator VCO to provide a base frequency output at the highest frequency of the base frequency generator VCO (e.g. 604), and the critical level is at a voltage level substantially similar to a voltage level (606) that provides a highest frequency of the base frequency generator VCO. See also FIG. 200), which shows a simplified transition between 10 GHz and 20 GHz with different frequency divider settings.

As previously discussed, the invention may be implemented using various types of frequency synthesizers. As one example, the invention may be implemented using frequency synthesizers according to the methods of Chenakin (U.S. Pat. No. 9,793,904) the entire contents of which are incorporated herein by reference. Other types of frequency synthesizer circuit, so long as they generally follow the overall configuration previously discussed in FIG. 1, may also be used.

Figure 8:
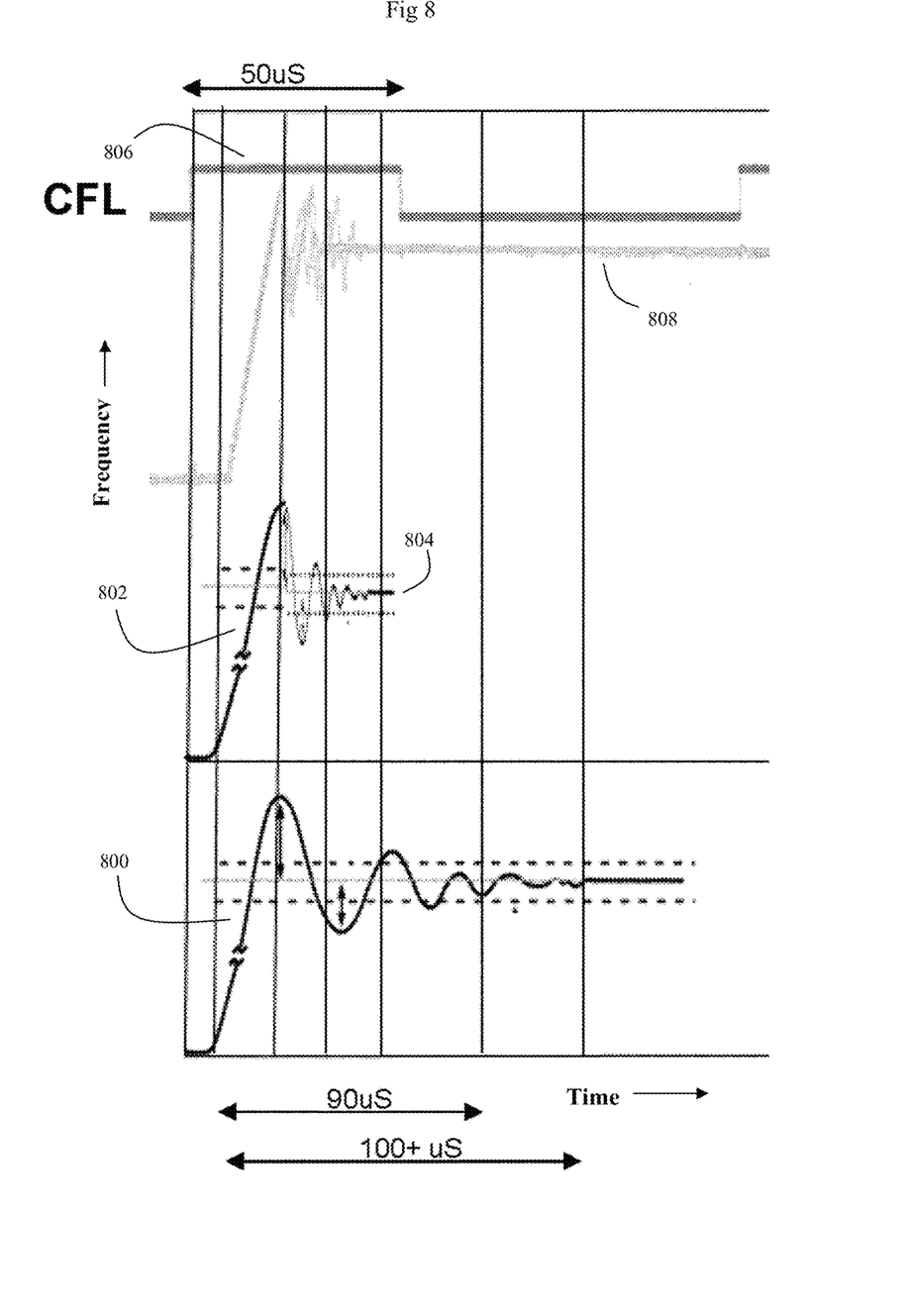
FIG. 8 shows a more detailed time plot of the invention's improved two-step VCO voltage adjust system.

FIG. 8 shows a more detailed time plot showing how the invention's improved two-step VCO voltage adjust system substantially improves the time it takes for the system to produce a stable frequency output. Here the problem with prolonged ringing oscillation which occurs when the VCO is jumped from a very low voltage to a high voltage above the critical level is shown as (800); the effect of the invention's improved two-step voltage jump methods is shown as (802). The net effect of the improvement (or optimized method) is to produce a stabilized and optimized base frequency output signal (804) within the time period of a 50 microsecond clock frequency lock (CFL) time period (806). An expanded time plot of the optimized method is also shown (808), showing that the VCO now remains stable for long periods of time.

In some embodiments, the invention may further rely upon the QSPI peripheral control methods of Argoetti (U.S. Pat. No. 9,734,099) the entire contents of which are incorporated herein by reference. Such methods allow a processor to rapidly change the state of various peripherals, such as various components in the base frequency generator and frequency divider devices discussed herein, and can further help enable rapid frequency shifting speeds (e.g. short times to reset computer wideband VCO to new frequencies). These methods generally operate by using processors with processor driven master QSPI interfaces.

Here, for example, assume that the base frequency generator VCO and the frequency divider comprise a plurality of slave SPI interface peripherals. To further help achieve short switching times, the processor can be configured to issue commands to the base frequency generator VCO and the frequency divider by using the processor-driven master QSPI interface to simultaneously and time-synchronously transmit data from a FIFO buffer to these various slave SPI interface peripherals. According to the methods of commonly owned and invented U.S. Pat. No. 9,734,099, incorporated herein by reference, this can be done by using the processor to load the processor FIFO buffer for the master QSPI interface with at least two streams of time-synchronized data intended for simultaneous transmission to the various slave SPI interface peripherals.

Put alternatively, in some embodiments, the invention's processor (102) may further comprise a processor driven master QSPI interface, and the base frequency generator VCO (100) or D/A converter (104) and the frequency divider (106) may be slave SPI interface peripherals (e.g. may be a plurality of slave SPI interface peripherals). In these embodiments, the processor can issue commands to the base frequency generator VCO (100) and said frequency divider (106) by using the processor-driven master QSPI interface to simultaneously and time-synchronously transmit data from a FIFO buffer to this plurality of slave SPI interface peripherals. This can be done, for example, by using the processor to load the FIFO buffer the said master QSPI interface with at least two streams of time-synchronized data intended for simultaneous transmission to the plurality of slave SPI interface peripherals.

The invention claimed is:

1. A method for optimizing a frequency switching speed of a computer controlled microwave frequency synthesizer (wideband VCO) comprising a computer processor, a base frequency generator Voltage Controlled Oscillator (VCO) and a frequency divider, said method comprising:

adjusting, using said processor, a first output frequency of said wideband VCO by providing a first voltage setting command and first voltage to said base frequency generator VCO, thereby producing a base frequency output, and also providing a frequency division value command to said frequency divider, thus directing said frequency divider to divide said base frequency output by said frequency division value;

wherein a wideband VCO output frequency of said wideband VCO is determined by said base frequency output divided by said frequency division value;

wherein a change in input voltage, from below a critical level to above a critical level, to said base frequency generator VCO produces base frequency oscillations with an undesired stabilization time that exceeds a desired stabilization time;

switching said wideband VCO to a second wideband VCO output frequency by determining in advance, using said processor, when said second wideband VCO output frequency will require a second voltage setting command with a second voltage that, given said first voltage, will induce said base frequency oscillations; and using said processor to adjust a second output frequency of said wideband VCO by implementing said second voltage setting command as at least a two-step process;

wherein an initial step is an initial step voltage resetting command that provides voltage to said base frequency generator VCO at an initial step level above said first voltage, but below said critical level;

wherein a subsequent step is a subsequent voltage resetting command that provides voltage to said base frequency generator VCO at said second voltage setting;

and wherein a time difference between said initial step and said subsequent step is less than said undesired stabilization time.

2. The method of claim 1, wherein said base frequency generator VCO further comprises a phase locked loop (PLL).

3. The method of claim 1, wherein said base frequency oscillations with an undesired stabilization time comprise damped ringing oscillations.

4. The method of claim 3, wherein said damped ringing oscillations require more than 50 microseconds to stabilize.

5. The method of claim 1, wherein said time difference between said initial step and said subsequent step is less than 20 microseconds.

6. The method of claim 1, wherein said first voltage causes said base frequency generator VCO to provide a base frequency output at a lowest frequency of said base frequency generator VCO, and said second voltage causes said base frequency generator VCO to provide a base frequency output at a highest frequency of said base frequency generator VCO, and said critical level is at a voltage level substantially similar to a voltage level that provides a highest frequency of said base frequency generator VCO.

7. The method of claim 1, wherein said at least a two-step process comprises two steps, said two steps comprising said initial step and said subsequent step.

8. The method of claim 1, wherein said frequency divider comprises a frequency divider VCO, a phase lock loop (PLL), and a frequency divider.

9. The method of claim 1, wherein a lowest frequency of said base frequency generator VCO is a multiple of a lowest frequency of said wideband VCO, so that said processor must determine both said first voltage setting command and said frequency division value command to direct said wideband VCO to deliver an arbitrary frequency output of said wideband VCO.

10. The method of claim 1, wherein said processor further comprises a processor driven master Quad Serial Peripheral Interface (QSPI) interface, said base frequency generator VCO and said frequency divider comprise a plurality of slave Serial Peripheral Interface (SPI) interface peripherals, and said processor issues commands to said base frequency generator VCO and said frequency divider by using said processor driven master QSPI interface to simultaneously and time-synchronously transmit data from a First In First Out (FIFO) buffer to a plurality of said slave SPI interface peripherals by using said processor to load said FIFO buffer for said master QSPI interface with at least two streams of time-synchronized data intended for simultaneous transmission to said plurality of slave SPI interface peripherals.

11. A computer controlled microwave frequency synthesizer device (wideband VCO), comprising:
a computer processor, a base frequency generator Voltage Controlled Oscillator (VCO) and a frequency divider;
said processor configured to adjust a first output frequency of said wideband VCO by providing a first voltage setting command and first voltage to said base frequency generator VCO, thereby producing a base frequency output, and also providing a frequency division value command to said frequency divider, thus directing said frequency divider to divide said base frequency output by said frequency division value;
wherein a wideband VCO output frequency of said wideband VCO is determined by said base frequency output divided by said frequency division value;
wherein a change in input voltage, from below a critical level to above a critical level, to said base frequency generator VCO produces base frequency oscillations with an undesired stabilization time that exceeds a desired stabilization time;
said processor further configured to switch said wideband VCO to a second wideband VCO output frequency by determining in advance when said second wideband VCO output frequency will require a second voltage setting command with a second voltage that, given said first voltage, will induce said base frequency oscillation, and to adjust a second output frequency of said wideband VCO by implementing said second voltage setting command as at least a two-step process;
wherein an initial step is an initial step voltage resetting command that provides voltage to said base frequency generator VCO at an initial step level above said first voltage, but below said critical level;
wherein a subsequent step is a subsequent voltage resetting command that provides voltage to said base frequency generator VCO at said second voltage setting;
and wherein a time difference between said initial step and said subsequent step is less than said undesired stabilization time.

12. The device of claim 11, wherein said base frequency generator VCO further comprises a phase locked loop (PLL).

13. The device of claim 11, wherein said base frequency oscillations with an undesired stabilization time comprise damped ringing oscillations.

14. The device of claim 13, wherein said damped ringing oscillations require more than 50 microseconds to stabilize.

15. The device of claim 11, wherein said time difference between said initial step and said subsequent step is less than 20 microseconds.

16. The device of claim 11, wherein said first voltage causes said base frequency generator VCO to provide a base frequency output at a lowest frequency of said base frequency generator VCO, and said second voltage causes said base frequency generator VCO to provide a base frequency output at a highest frequency of said base frequency generator VCO, and said critical level is at a voltage level substantially similar to a voltage level that provides a highest frequency of said base frequency generator VCO.

17. The device of claim 11, wherein said at least a two-step process comprises two steps, said two steps comprising said initial step and said subsequent step.

18. The device of claim 11, wherein said frequency divider comprises a frequency divider VCO, a phase lock loop (PLL), and a frequency divider.

19. The device of claim 11, wherein a lowest frequency of said base frequency generator VCO is a multiple of a lowest frequency of said wideband VCO, so that said processor must determine both said first voltage setting command and said frequency division value command to direct said wideband VCO to deliver an arbitrary frequency output of said wideband VCO.

20. The device of claim 11, wherein said processor further comprises a processor driven master Quad Serial Peripheral Interface (QSPI) interface, said base frequency generator VCO and said frequency divider comprise a plurality of slave Serial Peripheral Interface (SPI) interface peripherals, and said processor is configured to issue commands to said base frequency generator VCO and said frequency divider by using said processor driven master QSPI interface to simultaneously and time-synchronously transmit data from a First In First Out (FIFO) buffer to a plurality of said slave SPI interface peripherals by using said processor to load said FIFO buffer for said master QSPI interface with at least two streams of time-synchronized data intended for simultaneous transmission to said plurality of slave SPI interface peripherals.

* * * * *